United States Patent [19]
Tesch et al.

[11] Patent Number: 5,949,362
[45] Date of Patent: Sep. 7, 1999

[54] DIGITAL-TO-ANALOG CONVERTER INCLUDING CURRENT CELL MATRIX WITH ENHANCED LINEARITY AND ASSOCIATED METHODS

[75] Inventors: Bruce J. Tesch, Melbourne, Fla.; Renyuan Huang, Salt Lake City, Utah; Kantilal Bacrania, Palm Bay; Gregory J. Fisher, Indialantic, both of Fla.

[73] Assignee: Harris Corporation, Palm Bay, Fla.

[21] Appl. No.: 08/916,569

[22] Filed: Aug. 22, 1997

[51] Int. Cl.$^6$ ..................................... H03M 1/66
[52] U.S. Cl. ............................ 341/144; 341/153
[58] Field of Search .................... 341/144, 153, 341/154, 133, 136

[56] References Cited

U.S. PATENT DOCUMENTS

| | | | |
|---|---|---|---|
| 3,995,304 | 11/1976 | Pease | 341/144 |
| 4,695,826 | 9/1987 | Ando et al. | 341/144 |
| 4,812,818 | 3/1989 | Colles | 341/118 |
| 4,859,930 | 8/1989 | Schouwenaars et al. | 341/133 |
| 4,864,215 | 9/1989 | Schouwenaars et al. | 341/144 |
| 5,056,838 | 10/1991 | Tsuji et al. | 341/133 |
| 5,568,145 | 10/1996 | Reynolds . | |

FOREIGN PATENT DOCUMENTS

| | | |
|---|---|---|
| 04-162830 | 6/1992 | Japan . |
| 08-330966 | 12/1996 | Japan . |

OTHER PUBLICATIONS

Cornelius A.A. Bastiaansen, et al., "A 10–b 40–MHz 0.8–μm CMOS Current–Output D/A Converter," IEEE Journal of Solid–State Circuits, vol. 26, No. 7, Jul. 1991, pp. 917–921.

Douglas Mercer, et al., "12–b 125 MSPS CMOS D/A Designed For Spectral Performance," ISLPED, Aug. 1996, pp. 243–246.

Douglas Mercer, "A 16–b D/A Converter with Increased Spurious Free Dynamic Range," IEEE Journal of Solid–State Circuits, vol. 29, No. 10, Oct. 1994, pp. 1180–1185.

Takahiro Miki, et al., "An 80–MHz 8–bit CMOS D/A Converter, " IEEE Journal of Solid–State Circuits, vol. SC–21, No. 6, Dec. 1986, pp. 983–988.

Tien–Yu Wu, et al., "A Low Glitch 10–bit MHz CMOS Video D/A Converter," IEEE Journal of Solid–State Circuits, vol. 30, No. 1, Jan. 1995, pp. 68–72.

Marcel J.M. Pelgrom, et al., "Matching Properties of MOS Transistors," IEEE Journal of Solid–State Circuits, vol. 24, No. 5, Oct. 1989, pp. 1433–1439.

*Primary Examiner*—Howard L. Williams
*Attorney, Agent, or Firm*—Allen, Dyer, Doppelt, Milbrath & Gilchrist, P.A.

[57] ABSTRACT

A digital-to-analog converter (DAC) includes a first array of current source cells extending in first and second transverse directions, and a two-dimensional symmetrical controller for operating current source cells of the first array based upon at least a portion of digital input words and in a symmetrical sequence in both the first and second directions with respect to a medial position of the first array. The medial position preferably defines a centroid for the first array. The two-dimensional symmetrical controller may preferably include a decoder for generating a plurality of control signals based upon predetermined most significant bits (MSBs) of digital input words. Another aspect of the invention relates to the treatment of the LSBs. According to this aspect, the first array further comprises a plurality of second current source cells, and the two-dimensional symmetrical controller further operates the plurality of second current source cells based upon predetermined LSBs of digital input words. The DAC may include a substantially identical second array adjacent the first array. The two-dimensional symmetrical controller may operate the current source cells in the first and second arrays in pairs and in a substantially mirror image sequence to provide geometrical averaging. The geometrical averaging may operate the current source cells in the first and second arrays in pairs and in a substantially true mirror or inverted mirror image sequence.

51 Claims, 6 Drawing Sheets

FIG. 6

DIGITAL-TO-ANALOG CONVERTER INCLUDING CURRENT CELL MATRIX WITH ENHANCED LINEARITY AND ASSOCIATED METHODS

FIELD OF THE INVENTION

The present application relates to the field of electronic circuits, and, more particularly, to a digital-to-analog converter (DAC) and related methods.

BACKGROUND OF THE INVENTION

Digital-to-analog converters are widely used for converting digital signals to corresponding analog signals for many electronic circuits. For example, a high resolution, high speed digital-to-analog converter (DAC) may find applications in cellular base stations, wireless communications, direct digital frequency synthesis, signal reconstruction, test equipment, high resolution imaging systems and arbitrary waveform generators, for example.

An integrated circuit DAC is described, for example, in U.S. Pat. No. 3,961,326 to Craven entitled "Solid State Digital to Analog Converter". The DAC includes binarily scaled constant current sources with associated switch cells employing bipolar transistors to direct the bit currents either to a current summing bus or to ground. Each of the switch cells includes a first differential transistor pair driving a second differential pair of current switching transistors.

An article entitled "A 16-b D/A Converter with Increased Spurious Free Dynamic Range" by Mercer in the IEEE Journal of Solid-State Circuits, Vol. 29, No. 10, October 1994, pp. 1180–1185 discloses another DAC. The article identifies the two broad categories of errors or distortion in digital-to-analog conversion. Segmentation of the bits and laser trimming of thin film resistors are often used to minimize static errors. Dynamic or AC errors include non-linear settling, ringing, non-symmetric slew, and glitch. Thermometer decoding of the most significant bits along with high-speed process technologies are often employed to minimize the dynamic errors. Segmentation of the four most significant bits into 15 currents of equal size is disclosed. An R/2R ladder is used with the 12 current sources for the least significant bits. Laser trimmable thin-film resistors are used in the DAC current sources to allow trimming to reduce linearity errors.

Unfortunately when a DAC switches from one code to the next there typically exists some asymmetry in the speed that the bit switch turns on and turns off. This results in the output of the DAC going in the wrong direction for a short time until all of the switches have fully switched. The resulting error or glitch in the output is code dependent and thus produces harmonic distortion or other nonharmonic spurs in the output spectrum. Glitch is often tested at the major carry of the DAC and there will be a spike in the output as the DAC switches. Glitch is typically considered as the net area under that spike.

There have been attempts to further reduce glitch in a DAC and thereby reduce harmonic distortion and other spurs in the output spectrum. For example, a DAC for video applications is disclosed in an article entitled "A Low Glitch 10-bit 75-MHZ CMOS Video D/A Converter" by Wu et al. in the IEEE Journal of Solid-State Circuits, Vol. 30, No. 1, January 1995. The DAC includes a segmented antisymmetric switching sequence and an asymmetrical switching buffer. The DAC includes a large number of non-weighted current sources for the seven most significant bits, and weighted current sources for the three least significant bits. The current sources may be non-uniform for various reasons, such as layout mismatch, thermal distribution, and process deviation. A segmented antisymmetric switching sequence is disclosed to suppress the superposition of graded error, symmetrical error, and especially random error. The asymmetrical switch control avoids simultaneously turning off the differential switching transistors completely, but allow simultaneous turn-on for a short period of time.

An article entitled "Matching Properties of MOS Transistors" by Pelgrom et al. appearing in the IEEE Journal of Solid-State circuits, Vol. 24, No. 5, October 1989, pp. 1433–1439 discloses that mismatch is the process that causes time-independent random variations in physical quantities of identical designed devices, and is a limiting factor in DACs, for example. Many known processes which cause mismatching include distribution of ion-implanted, diffused, or substrate ions; local mobility fluctuations; oxide granularity; oxide charges; etc. In particular, the article discloses that edge roughness seems not to be a major mismatch factor, leaving mobility and gate oxides as possible mismatch causes. The relative effect on the mismatch due to the distance is only significant for large-area devices with a considerable spacing. Correlation of the threshold-voltage variations with the current-factor variations shows that there is no significant mutual component for closely spaced transistor pairs; gate-oxide granularity is consequently not an important mismatch cause that affects both threshold voltage and current factor. It is reported that the threshold mismatch nearly halves with gate oxides thinner by a factor of two, whereas the current-factor mismatch remains constant. The variance of the threshold voltage, the current factor, and the substrate factor are inversely proportional to the transistor area. The mismatch in the threshold voltage dominates the transistor performance for normal gate-source potentials.

An article entitled "An 80-MHZ 8-bit CMOS D/A Converter" by Miki et al. in the IEEE Journal of Solid-State Circuits, vol. Sc-21, No. 6, December 1986, pp. 983–988, discloses a current cell matrix configuration to relax the mismatch problem of small-size transistors in a DAC. The linearity error caused by an undesirable current distribution of the current sources is described as having been reduced by symmetrical switching in a single dimension of the matrix as shown in FIG. 10 of the article. Unfortunately, as DACs become larger and operate at higher speeds, process variations and gradients may still impose relatively high non-linearities in a DAC even with symmetrical switching in one dimension of the current source array.

SUMMARY OF THE INVENTION

In view of the foregoing background, it is therefore an object of the present invention to provide a DAC and related methods having high accuracy and linearity despite process variations.

This and other objects, advantages and features of the present invention are provided by a DAC which in one embodiment comprises a first array of current source cells extending in first and second transverse directions, and two-dimensional symmetrical control means for operating predetermined current source cells based upon a portion of digital input words and in a symmetrical sequence in both the first and second directions with respect to a medial position of the first array. The medial position preferably defines a centroid for the first array. Accordingly, the DAC is less susceptible to variations in threshold voltage and current factor as may otherwise be caused by process gradients, for example.

The first array may also include first and second rows of current source cells. In addition, the two-dimensional symmetrical control means may comprise a decoder for generating the control signals, and means for operating the first row with even control signals and for operating the second row with odd control signals.

The current source cells may have substantially equal output currents. The two-dimensional symmetrical control means may preferably include a decoder for generating a plurality of control signals based upon predetermined most significant bits (MSBs) of digital input words. In this embodiment, the decoder is preferably a thermometer decoder.

Another aspect of the invention relates to the treatment of the least significant bits (LSBs). According to this aspect, the first array further comprises a plurality of second current source cells, and the two-dimensional symmetrical control means further comprises LSB cell control means for operating the plurality of second current source cells based upon predetermined LSBs of digital input words. In one embodiment, at least some of the second plurality of current source cells are positioned in a medial portion of the first array. More particularly, each of the second plurality of current source cells preferably comprises a plurality of current source devices which, in turn, may have substantially same output currents. In this embodiment, the LSB cell control means operates predetermined ones of the current source devices for binarily weighting the cell outputs. Alternately, the second plurality of current source cells comprises weighted output current source cells for the LSBs.

Yet another aspect of the present invention relates to geometrical averaging which may also further enhance the linearity of the DAC. The DAC may include a substantially identical second array adjacent the first array. The two-dimensional symmetrical control means may include geometrical averaging means for operating the current source cells in the first and second arrays in pairs and in a substantially true mirror image sequence. The geometrical averaging means may alternately operate the current source cells in the first and second arrays in pairs and in a substantially inverted mirror image sequence.

The DAC may also include output means connected to the array for producing analog output signals based upon digital input words. Each of the current source cells may comprise a plurality of current source devices positioned in side-by-side or in-line relation. Alternately, each of the current source cells may include a plurality of current source devices positioned in a generally rectangular pattern of rows and columns. Each of the current source devices of a cell may comprise at least one CMOS transistor. In addition, dummy cells may be provided adjacent the array to thereby reduce undesirable edge effects.

Another embodiment of DAC comprises a first array of current source cells extending in first and second transverse directions, with each current cell comprising a plurality of current source devices arranged in a line. This embodiment further includes two-dimensional symmetrical control means for operating predetermined current source cells of the first array based upon most significant bits (MSBs) of digital input words and in a symmetrical sequence in both the first and second directions with respect to a medial position of the first array. Moreover, additional current source devices are positioned in-line with the current source devices of the array to define a V-shaped diagonal pattern through the array. Accordingly, this embodiment preferably further includes LSB control means for operating the additional current source devices based upon the LSBs of digital input words.

Yet another embodiment of a DAC comprises an array of current source devices, and matrix switch control means for operating predetermined current source devices in a sequential matrix pattern. The matrix pattern is preferably defined by a plurality of generally rectangular submatrix patterns, with each submatrix pattern, in turn, being a substantially mirror image of adjacent submatrices.

A method aspect of the invention is for operating a DAC comprises a first array of current source cells extending in first and second transverse directions. The method preferably comprises the step of operating predetermined current source cells of the first array based upon at least a portion of digital input words and in a symmetrical sequence in both the first and second directions with respect to a medial position of the first array.

BRIEF DESCRIPTION OF THE DRAWINGS

FIG. 6 is a schematic diagram of a fifth current source cell matrix embodiment as also used in the DAC of FIG. 1.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
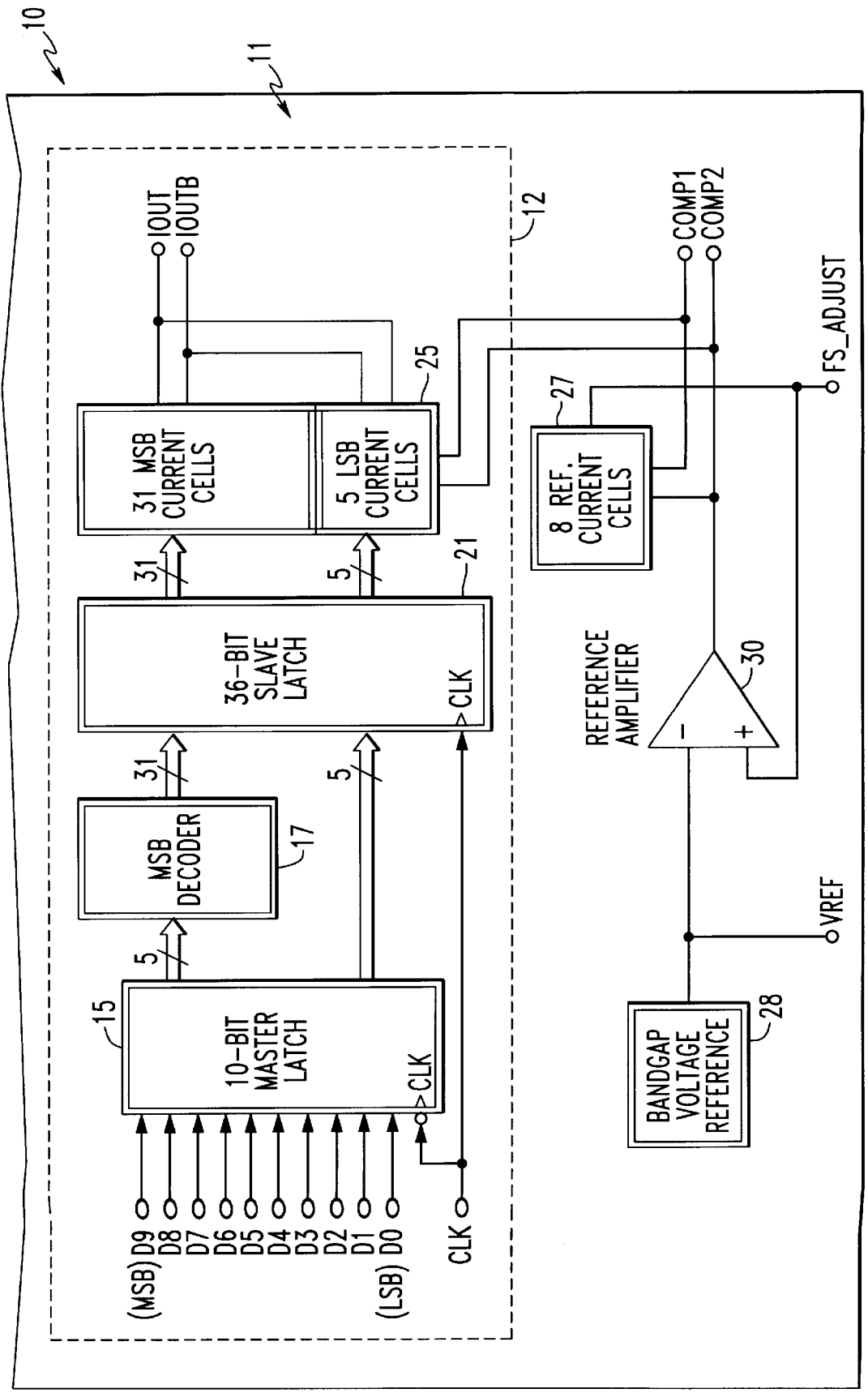
FIG. 1 is a schematic block diagram of a DAC in accordance with the present invention.
Figure 2:
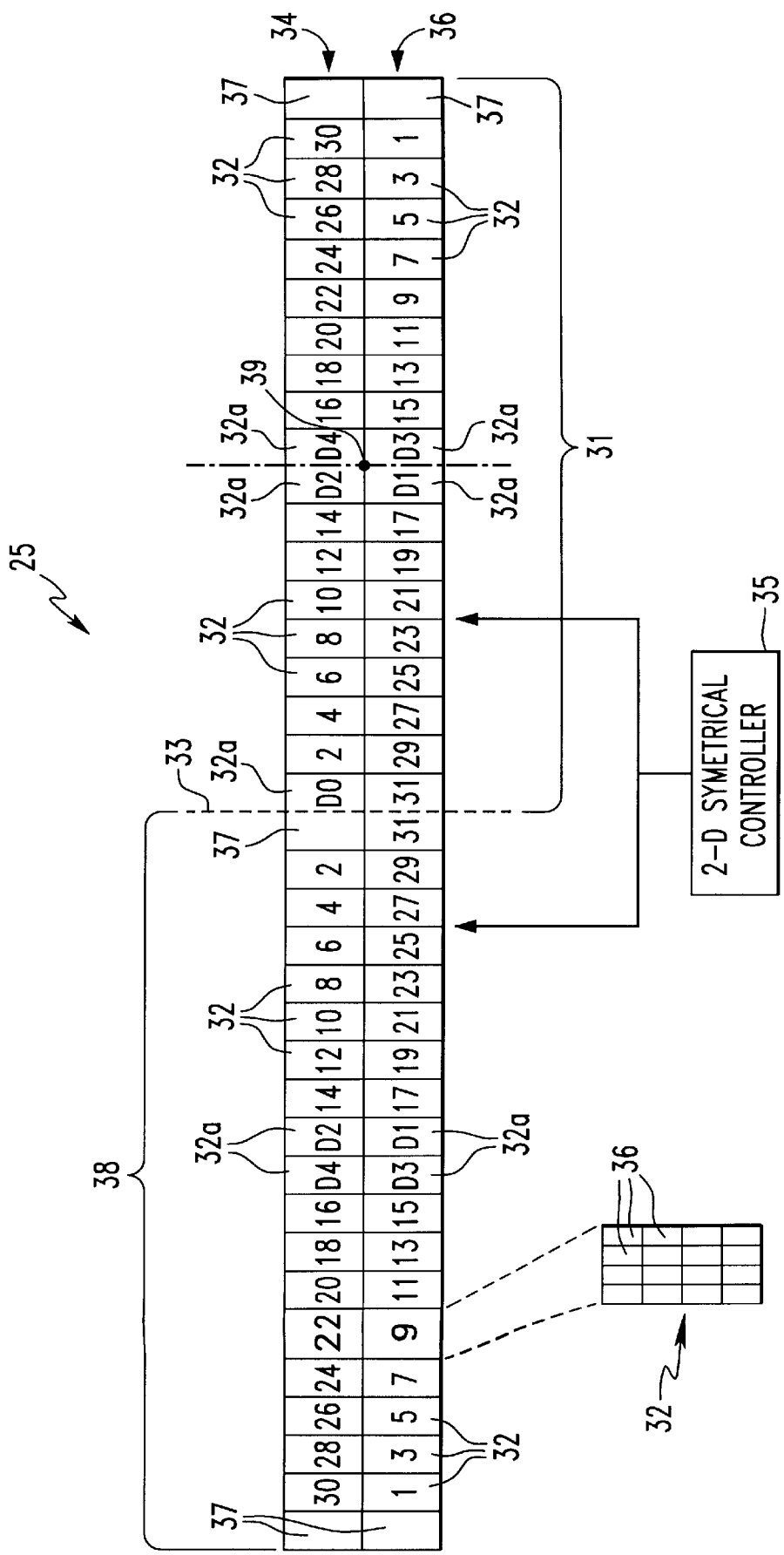
FIG. 2 is a schematic diagram of a first current source cell matrix embodiment as used in the DAC of FIG. 1 and with one current source cell shown in an enlarged portion.

Referring initially to FIGS. 1 and 2, an integrated circuit 10 including a first embodiment of a DAC 11 in accordance with the invention is now explained. The DAC 11 uses a segmented architecture to reduce both differential non-linearity (DNL) and glitch energy. Input data words first pass through the illustrated 10-bit master latch 15 which is transparent when the clock signal is low. The five most significant bits (MSBs) then pass through a 5-to-31 thermometer decoder 17 in which an increasing number of output signals go high as the input code is increased as would be readily understood by those skilled in the art. These 31 control signals then pass through the illustrated 36-bit slave D-latch 21 which is transparent when the clock signal is high. The master-slave arrangement synchronizes the data to reduce glitch energy as would also be readily understood by those skilled in the art.

The 36 outputs from the slave D-latch 21 control the current steering switches in the current source array 25. The 31 MSB current cells (segments) each have a value of $1/32$ of the full-scale current output current. The 5 LSB current cells are binary weighted fractions of the segment current, that is, ½, ¼, ⅛, ⅟₁₆ and ⅟₃₂ for bits D4 to D0, respectively.

As shown in the illustrated embodiment, eight additional reference current cells 27 are connected in a feedback configuration with the reference amplifier 30 to establish a desired full-scale output current for a plurality of DACs as may typically be included on a chip, and as would be readily understood by those skilled in the art. The two COMP terminals connect to external decoupling capacitors, not shown, which absorb switching transients on these bias lines for improved dynamic performance. A bandgap voltage reference 28 provides a precision voltage to the reference amplifier 30 for use in establishing the full scale current as will be readily appreciated by those skilled in the art.

In the illustrated embodiments, 10-bit DACs are described wherein the input words are separated into 5 MSBs and 5 LSBs. Those of skill in the art will appreciate that larger or smaller DACs are contemplated by the invention and that the division of MSBs and LSBs may also determined as desired for a particular DAC.

Referring now more particularly to FIG. 2 a first embodiment of the current matrix 25 in accordance with the invention is further described. This embodiment comprises a first array 31 of current source cells 32 positioned to the right of the dashed line 33. The cells of the first array 31 extend in first and second transverse directions. More particularly, two-dimensional symmetrical control means 35 as schematically illustrated is provided for operating predetermined current source cell of the first array 31 based upon at least a portion of digital input words and in a symmetrical sequence in both the first and second directions with respect to a medial position of the first array. The medial position preferably defines a centroid for the first array as shown by the illustrated imaginary point labeled 39. The two-dimensional symmetrical controller 35 may be provided by the decoder 17 and its associated circuitry which control the individual current source cells 32 as would be readily understood by those skilled in the art. As an increasing number of current sources are switched, the current sources labeled 1–31 are sequentially operated. Accordingly, the DAC 25 is less susceptible to variations in threshold voltage and current factor as may otherwise be caused by process gradients, for example.

As shown, the first array 31 may also include first and second rows 34, 36 of current source cells 32. The two-dimensional symmetrical control means 35 generates a plurality of control signals which are coupled to the array so that the first row is operated with even control signals and the second row is operated with odd control signals. The even signals increase from left to right in the first array 31, while the odd signals decrease from left to right to thereby provide the symmetrical switching. Moreover, the signals also symmetrically switch between the first and second rows to provide the two-dimensional symmetry and its associated improvement in reducing non-linearities caused by process gradients.

The current source cells 32 labeled 1–31 are for the MSBs and therefore have substantially equal output currents. Dummy cells 37 are positioned at the right of the first array 31 to thereby reduce undesirable effects as would otherwise be caused at the active edge cells as would be readily appreciated by those skilled in the art.

Referring briefly to the lower left hand portion of FIG. 2, one embodiment of a current source cell 32 is illustrated and includes a 4×4 arrangement of current source devices, such as CMOS transistors for example. Other arrangements are also contemplated by the invention and an in-line arrangement is described in further embodiments, for example.

Another aspect of the invention relates to the treatment of the LSBs. According to this aspect, the first array 31 further comprises a plurality of second current source cells or LSB cells 32a labeled as D0 through D4 in the figure. The two-dimensional symmetrical control means 35 further comprises LSB cell control means for operating the plurality of LSB current source cells 32a based upon predetermined LSBs of digital input words. As would be readily appreciated by those skilled in the art, at least some of the LSB current source cells (D1–D4) are positioned in a medial portion of the first array to also reduce the effects of process gradients. The LSB cells 32a may have binarily weighted output currents as would also be readily understood by those skilled in the art.

Yet another aspect of the DAC 25 of present invention relates to geometrical averaging which may also further enhance the linearity of the DAC. The DAC 25 may include a substantially identical second array 38 adjacent the first array 31. The two-dimensional symmetrical control means 35 may include geometrical averaging means for operating the current source cells 32 in the first and second arrays in pairs and in a substantially true mirror image sequence as shown in the illustrated embodiment of FIG. 2. For example, both cells of a pair may be connected to the same respective control signal and the output of each cell is half the desired combined output current. The geometrical averaging means may alternately operate the current source cells 32 in the first and second arrays in pairs and in a substantially inverted mirror image sequence as will be seen in later embodiments.

The LSB current source cells 32a are also substantially mirrored between the two arrays 31, 38. However, the LSB D0 is generally the smallest current that can be produced, has the least effect on accuracy, and is not duplicated in the second array 38 as will be appreciated by those skilled in the art.

Figure 3:
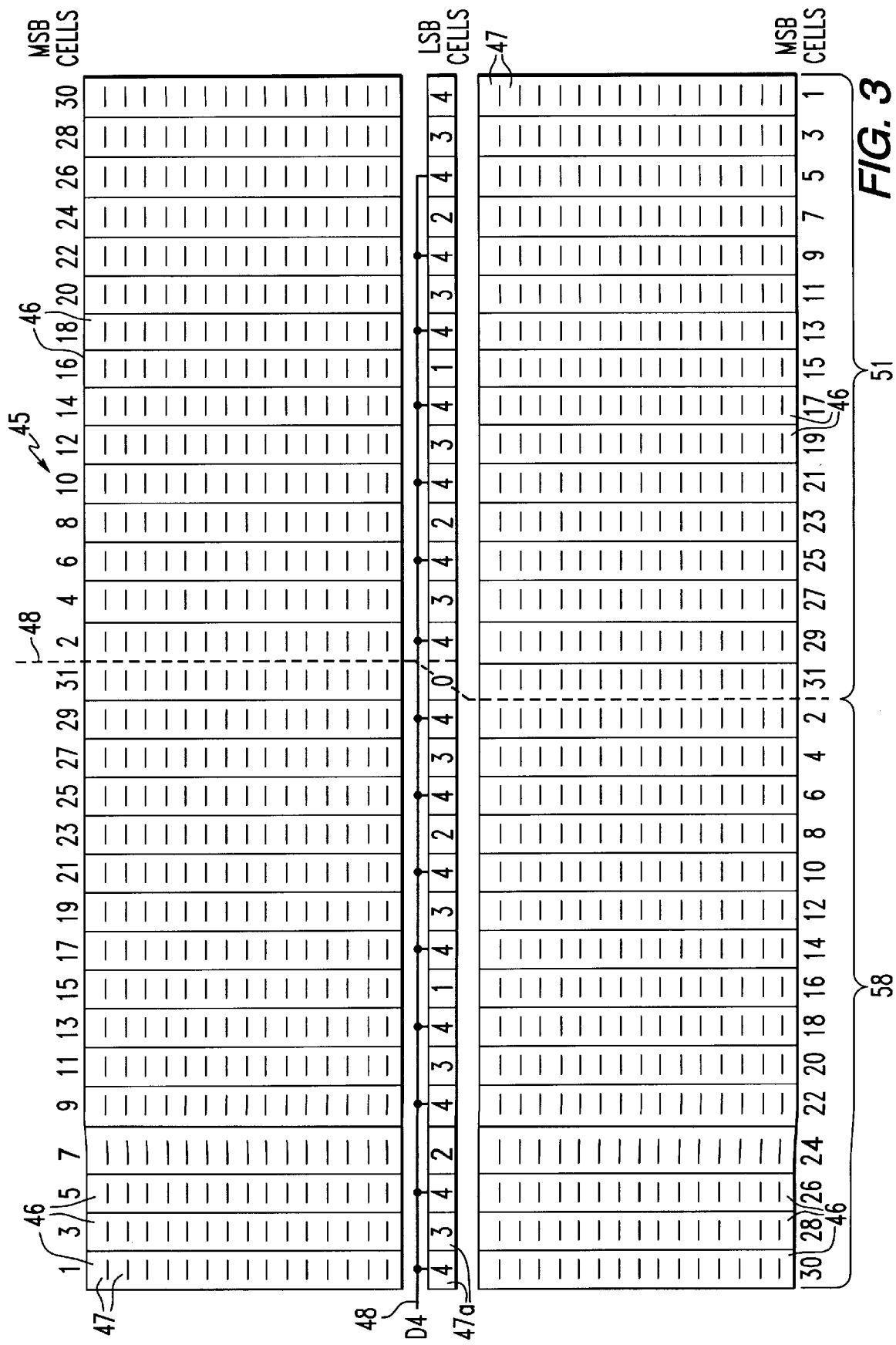
FIG. 3 is a schematic diagram of a second current source cell matrix embodiment as also used in the DAC of FIG. 1.

Turning now to FIG. 3 a second embodiment of a current source cell matrix 45 is now described. The two-dimensional symmetrical control means is not shown in this embodiment for greater clarity; rather, the numbers indicate the switching sequence for the MSB cells and the LSB cells. In this embodiment, the current cells 46 are defined by a plurality of current source devices 47, sixteen in the illustrated embodiment, connected in an in-line configuration. A different variation of mirror symmetry is also shown between the left hand array 58 and the right hand array 51. In this embodiment an inverted mirror image symmetry is provided about dashed line 48, as contrasted to the true mirror symmetry of the embodiment shown in FIG. 2. Of course, as would be readily understood by those skilled in the art, the illustrated matrix embodiment 45 enjoys the same benefits and advantages from both symmetrical switching and also geometrical averaging as discussed extensively above.

The matrix 45 also has a slightly different treatment for the LSB cells. The LSB cells are formed by selectively connecting predetermined and generally spaced apart ones of the current source devices 47a in the medial row between the upper and lower banks of MSB current source devices. For example, the D4 LSB cell is shown by the line 48 connecting the current source devices labeled 4 in the medial row. The other LSBs are configured similarly, with the number of connected current source devices based upon the desired scaled output current. Dummy current source devices, not shown, also desirably fill in the spaces between the banks and surround the overall active portion of the matrix 45.

Figure 4:
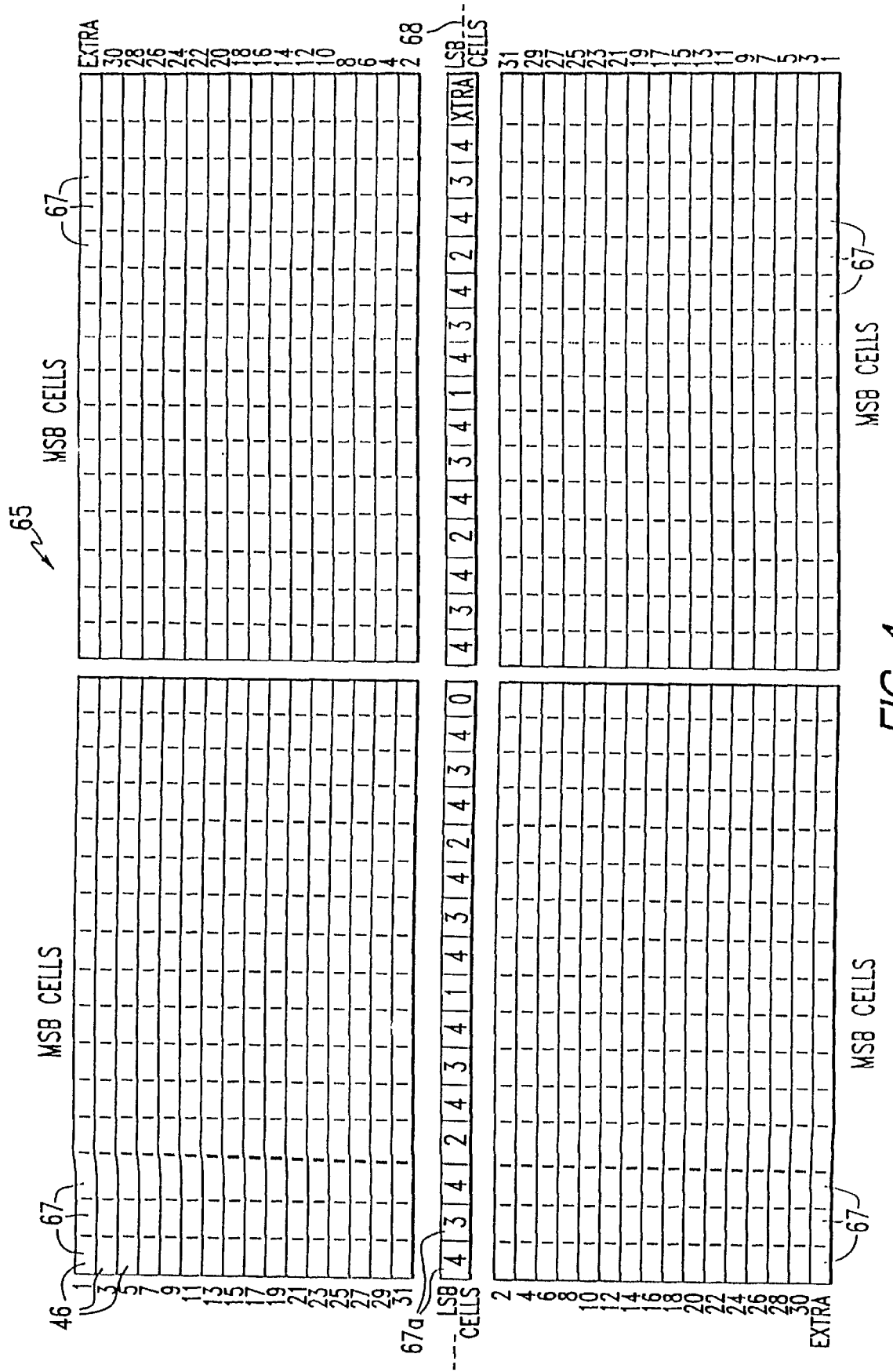
FIG. 4 is a schematic diagram of a third current source cell matrix embodiment as also used in the DAC of FIG. 1.

A third matrix embodiment 65 is understood with reference to FIG. 4. This embodiment includes an overall array of current source devices 67 similar to the embodiment shown in FIG. 3. However, in the matrix 65 of FIG. 4, the first and second arrays are in upper and lower positions relative to the dashed line 68. In addition, each cell 46 for the MSBs extends laterally. The LSB current source devices 67a are arranged between the upper and lower arrays and are connected as described above with reference to FIG. 3. This matrix embodiment 65 also has inverted mirror symmetry like the matrix embodiment 45 shown in FIG. 3. Dummy cells, not shown, are also desirably included in the matrix 65 as would be readily understood by those skilled in the art.

Figure 5:
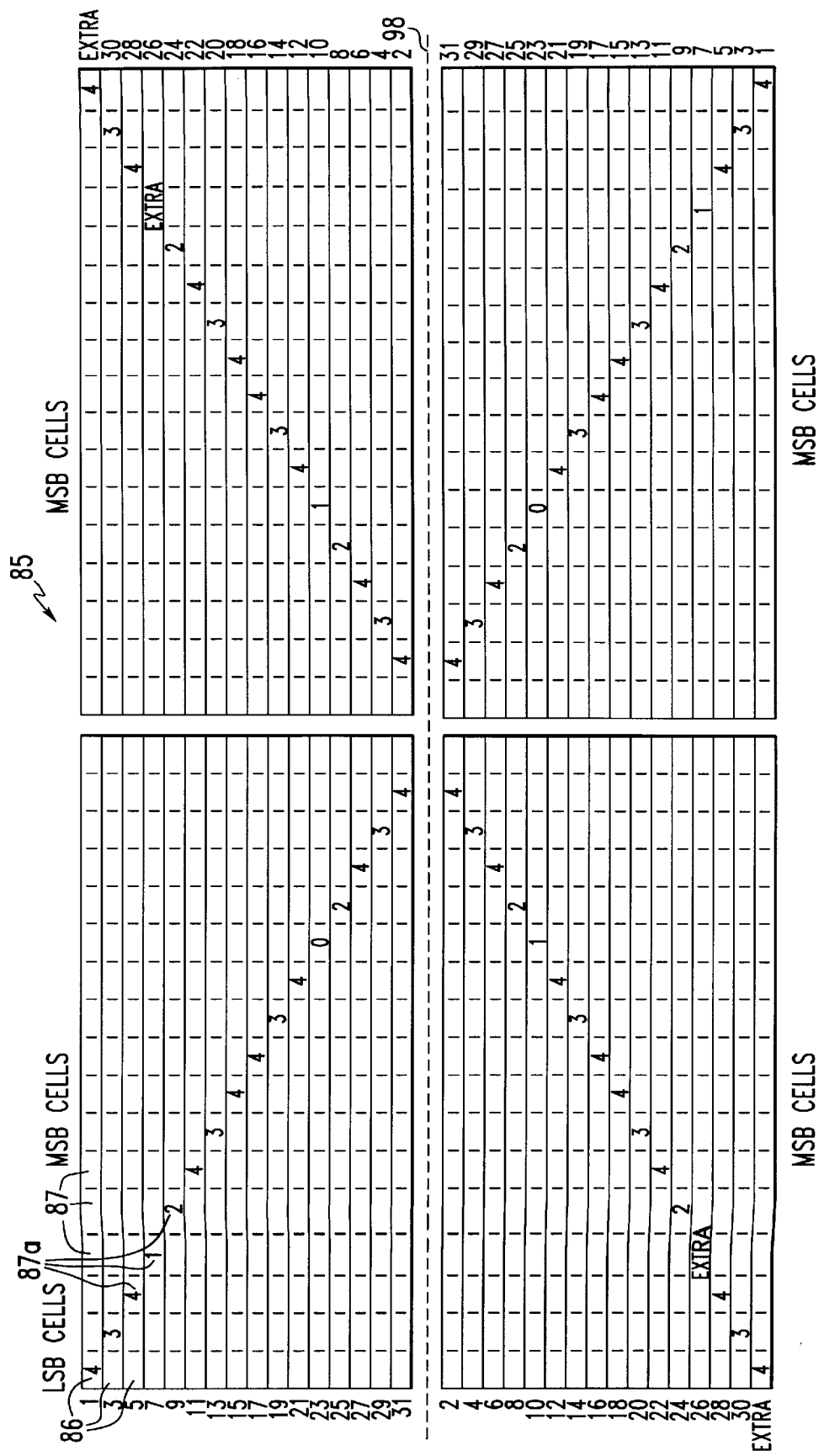
FIG. 5 is a schematic diagram of a fourth current source cell matrix embodiment as also used in the DAC of FIG. 1.

A fourth embodiment of a current cell/device matrix 85 is understood with reference to FIG. 5. In this embodiment, the arrays are above and below the dashed line 98 and the LSB current source devices 87a are connected from rows of current source devices 87 defining the MSB current cells. Moreover, the arrangement of LSB current source devices is such as to define a V-shaped pattern in the upper array, and to define an X-shape in the overall matrix 85. The positioning of the LSB current source devices 87a provides for a further enhancement of linearity even in the presence of process gradients as will be readily understood by those skilled in the art. Those of skill in the art will readily appreciate other configurations of positioning of the LSB current source devices within an overall arrangement of current source devices.

Figure 6:
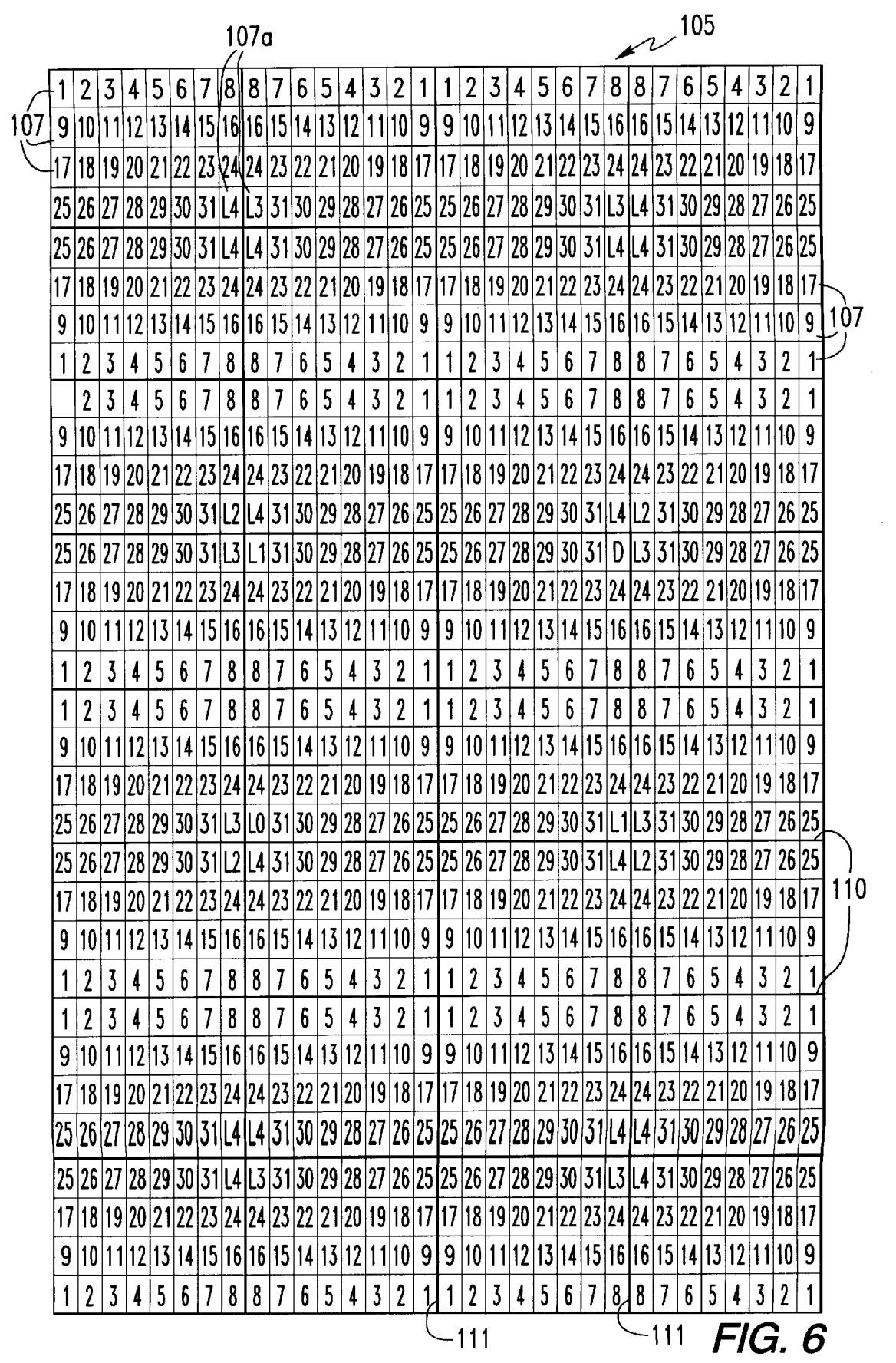

Yet another embodiment of a DAC current source matrix 105 is understood with further reference to FIG. 6. This embodiment includes an array of current source devices 107 for the MSBs and with interspersed devices 107b as indicated for the LSBs. In particular, the matrix 105 has a matrix pattern defined by a plurality of generally rectangular submatrix patterns, each defined between the illustrated horizontal grid lines 110 and the vertical grid lines 111. Each submatrix pattern, in turn, is a substantially mirror image of adjacent submatrices as illustrated. The LSB current source devices 107a are positioned at the submatrix corners and are assigned to provide geometrical spacing and the proper combined scaled output current. This embodiment also enjoys the benefits of symmetrical switching, as well as geometrical averaging.

Returning again briefly to FIG. 2, a method aspect of operating the DAC including the current source cell matrix 25 includes operating predetermined current source cells of the first array 31 based upon at least a portion of digital input words and in a symmetrical sequence in both the first and second directions with respect to a medial position 39 of the first array. The method may also include generating a plurality of control signals, and operating the first row with even control signals and operating the second row with odd control signals. In addition, the first array may further comprise a plurality of second current source cells for the LSBs, and the method may further comprise the step of operating the plurality of second current source cells based upon LSBs of digital input words.

The matrix 25 may also include a second array 38 adjacent the first array and being substantially identical thereto. Accordingly, the method may further include the step of operating the current source cells in the first and second arrays in pairs and in a substantially true mirror image sequence or in an inverted mirror image sequence.

Other method aspects of the invention will be readily understood by those skilled in the art based upon the discussion of the various embodiments of the current source matrices presented above. In addition, those of skill in the art will appreciate many uses for integrated circuits including one or more DACs as described herein. Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A digital-to-analog converter (DAC) comprising:
a first array of current source comprising first and second rows of cells extending in first and second transverse directions; and
two-dimensional symmetrical control means for operating predetermined current source cells of said first array based upon at least a portion of digital input words and in a symmetrical sequence in both the first and second directions with respect to a medial position of said first array, said two-dimensional symmetrical control means comprising a decoder for generating a plurality of control signals, and means for operating the first row with even control signals and for operating the second row with odd control signals.

2. A DAC according to claim 1 wherein each of said current source cells comprises a plurality of current source devices positioned in a generally rectangular pattern of rows and columns.

3. A DAC according to claim 1 wherein said current source cells have substantially equal output currents.

4. A DAC according to claim 3 wherein said decoder generates a plurality of control signals based upon predetermined most significant bits (MSBs) of digital input words.

5. A DAC according to claim 4 wherein said decoder is a thermometer decoder.

6. A DAC according to claim 1 wherein said first array further comprises a plurality of second current source cells; and wherein said two-dimensional symmetrical control means further comprises LSB cell control means for operating said plurality of second current source cells based upon predetermined least significant bits (LSBs) of digital input words.

7. A DAC according to claim 6 wherein at least some of said second plurality of current source cells are positioned in a medial portion of said first array.

8. A DAC according to claim 6 wherein each of said second plurality of current source cells comprises a plurality of current source devices having substantially same output currents; and wherein said LSB cell control means operates predetermined ones of the current source devices for binarily weighting outputs of current source cells of said second plurality of current source cells.

9. A DAC according to claim 6 wherein each of said second plurality of current source cells comprises a binarily weighted output current source cell.

10. A DAC according to claim 1 further comprising a second array adjacent said first array and being substantially identical thereto; and wherein said two-dimensional symmetrical control means comprises geometrical averaging means for operating the current source cells in the first and second arrays in pairs and in a substantially true mirror image sequence.

11. A DAC according to claim 1 further comprising a second array adjacent said first array and being substantially identical thereto; and wherein said two-dimensional symmetrical control means comprises geometrical averaging means for operating the current source cells in the first and second arrays in pairs and in a substantially inverted mirror image sequence.

12. A DAC according to claim 1 wherein the medial position defines a centroid for said first array.

13. A DAC according to claim 1 further comprising output means connected to said array for producing analog output signals based upon digital input words.

14. A DAC according to claim 1 wherein each of said current source cells comprises at least one CMOS transistor.

15. A DAC according to claim 1 further comprising dummy cells adjacent said first array.

16. A DAC according to claim 1 wherein each of said current source cells comprises a plurality of current source devices positioned in side-by-side relation.

17. A digital-to-analog converter (DAC) comprising:
first and second adjacent arrays of current source cells, each array extending in first and second transverse directions; and
two-dimensional symmetrical control means for operating predetermined current source cells of said first array based upon at least a portion of digital input words and in a symmetrical sequence in both the first and second directions with respect to a medial position of said first array;
said two-dimensional symmetrical control means further comprising geometrical averaging means for operating the current source cells in the first and second arrays in pairs and in a substantially mirror image sequence.

18. A DAC according to claim 17 wherein said substantially mirror image sequence is a substantially true mirror image sequence.

19. A DAC according to claim 17 wherein said substantially mirror image is a substantially inverted mirror image sequence.

20. A DAC according to claim 19 wherein each of said first and second arrays further comprises a plurality of second current source cells; and wherein said two-dimensional symmetrical control means further comprises LSB cell control means for operating said plurality of second current source cells based upon predetermined least significant bits (LSBs) of digital input words.

21. A DAC according to claim 20 wherein at least some of said second plurality of current source cells are positioned in a medial portion of said first array.

22. A DAC according to claim 20 wherein each of said second plurality of current source cells comprises a plurality of current source devices having substantially same output currents; and wherein said LSB cell control means operates predetermined ones of the current source devices for binarily weighting outputs of current source cells of said second plurality of current source cells.

23. A DAC according to claim 20 wherein each of said second plurality of current source cells comprises a binarily weighted output current source cell.

24. A DAC according to claim 17 wherein each of said first and second arrays comprises first and second rows of current source cells; and wherein said two-dimensional symmetrical control means comprises a decoder for generating a plurality of control signals, and means for operating the first rows with even control signals and for operating the second rows with odd control signals.

25. A DAC according to claim 17 wherein said current source cells have substantially equal output currents.

26. A DAC according to claim 25 wherein said two-dimensional symmetrical control means comprises a decoder for generating a plurality of control signals based upon predetermined most significant bits (MSBs) of digital input words.

27. A DAC according to claim 26 wherein said decoder is a thermometer decoder.

28. A DAC according to claim 17 wherein the medial position defines a centroid for said first array.

29. A DAC according to claim 17 further comprising output means connected to said array for producing analog output signals based upon digital input words.

30. A DAC according to claim 17 wherein each of said current source cells comprises at least one CMOS transistor.

31. A digital-to-analog converter (DAC) comprising:
a first array of current source cells extending in first and second transverse directions, each current cell comprising a plurality of current source devices arranged in a line;
two-dimensional symmetrical control means for operating predetermined current source cells of said first array based upon most significant bits (MSBs) of digital input words and in a symmetrical sequence in both the first and second directions with respect to a medial position of said first array;
a plurality of second current source devices defining a V-shaped diagonal pattern through said array; and
least significant bit (LSB) control means for operating the second current source devices based upon the LSBs of digital input words.

32. A DAC according to claim 31 wherein said first array comprises first and second rows of current source cells; and wherein said two-dimensional symmetrical control means comprises a decoder for generating a plurality of control signals, and means for operating the first row with even control signals and for operating the second row with odd control signals.

33. A DAC according to claim 31 wherein said current source cells have substantially equal output currents.

34. A DAC according to claim 31 further comprising a second array adjacent said first array and being substantially identical thereto; and wherein said two-dimensional symmetrical control means comprises geometrical averaging means for operating the current source cells in the first and second arrays in pairs and in a substantially inverted mirror image sequence to define an imaginary X-shaped line of symmetry.

35. A DAC according to claim 31 wherein the medial position defines a centroid for said first array.

36. A DAC according to claim 31 wherein each of said current source devices comprises at least one CMOS transistor.

37. A DAC according to claim 31 further comprising dummy cells adjacent said first array.

38. A digital-to-analog converter (DAC) comprising:
an array of current source devices; and
matrix control means for operating predetermined current source devices in a sequential matrix pattern defined by a plurality of generally rectangular submatrix patterns, each submatrix pattern being a substantially mirror image of adjacent submatrix patterns.

39. A DAC according to claim 38 wherein said matrix control means comprises means for operating the predetermined current source devices based upon most significant bits (MSBS) and least significant bits (LSBs) of digital input words.

40. A DAC according to claim 38 wherein each of said current source devices comprises at least one CMOS transistor.

41. A DAC according to claim 38 further comprising dummy cells adjacent said array.

42. A DAC according to claim 38 further comprising output means connected to said array for producing analog output signals based upon digital input words.

43. A method for operating a digital-to-analog converter (DAC) comprising a first array of current source cells extending in first and second transverse directions and comprising first and second rows of current source cells, the method comprising the step of:

operating predetermined current source cells of the first array based upon at least a portion of digital input words and in a symmetrical sequence in both the first and second directions with respect to a medial position of the first by generating a plurality of control signals and operating the first row with even control signals and operating the second row with odd control signals.

44. A method according to claim 43 wherein the first array further comprises a plurality of second current source cells; and further comprising the step of operating the plurality of second current source cells based upon predetermined least significant bits (LSBs) of digital input words.

45. A method according to claim 43 further comprising a second array adjacent the first array and being substantially identical thereto; and further comprising the step of operating the current source cells in the first and second arrays in pairs and in a substantially true mirror image sequence.

46. A method according to claim 43 further comprising a second array adjacent the first array and being substantially identical thereto; and further comprising the step of operating the current source cells in the first and second arrays in pairs and in a substantially inverted mirror image sequence.

47. A method for operating a digital-to-analog converter (DAC) comprising first and second adjacent arrays of current source cells, each array extending in first and second transverse directions, the method comprising the steps of:

operating predetermined current source cells of the first array based upon at least a portion of digital input words, and in a symmetrical sequence in both the first and second directions with respect to a medial position of the first array; and operating the current source cells in the first and second arrays in pairs for geometrical averaging.

48. A method according to claim 47 wherein each of the first and second arrays further comprises a plurality of second current source cells; and further comprising the step of operating the plurality of second current source cells based upon predetermined least significant bits (LSBs) of digital input words.

49. A method for operating a digital-to-analog converter (DAC) comprising an array of current source devices, the method comprising the step of:

operating predetermined current source devices in a sequential matrix pattern defined by a plurality of generally rectangular submatrix patterns, each submatrix pattern being a substantially mirror image of adjacent submatrices.

50. A method according to claim 49 further comprising the step of operating the predetermined current source devices based upon most significant bits (MSBs) and least significant bits (LSBs) of digital input words.

51. A method according to claim 49 further comprising the step of producing analog output signals based upon digital input words from the current source devices.

* * * * *